United States Patent [19]

Sasahara et al.

[11] 4,389,732
[45] Jun. 21, 1983

[54] TUNING DEVICE FOR RADIO RECEIVER

[75] Inventors: Yasumasa Sasahara; Hiroshi Kuroda, both of Hamamatsu, Japan

[73] Assignee: Nippon Gakki Seizo Kabushiki Kaisha, Hamamatsu, Japan

[21] Appl. No.: 193,111

[22] Filed: Oct. 2, 1980

[30] Foreign Application Priority Data

Oct. 3, 1979 [JP] Japan .............................. 54-127737
Oct. 3, 1979 [JP] Japan .............................. 54-127738

[51] Int. Cl.³ .......................... H04B 1/16; H03J 7/30
[52] U.S. Cl. ................................. 455/160; 74/10.45; 74/625; 455/162; 455/170
[58] Field of Search ............... 455/160, 162, 163, 170, 455/173; 358/193.1; 334/11, 18-20, 23; 74/625, 10.27, 10.45

[56] References Cited

U.S. PATENT DOCUMENTS 2,560,313 7/1951 Tellier .................................. 455/173
2,764,674 9/1956 Barton .................................. 455/170
3,806,820 4/1974 Uchiyama ............................ 455/218
3,854,342 12/1974 Smith, Jr. .............................. 455/162

Primary Examiner—Marc E. Bookbinder
Attorney, Agent, or Firm—Cushman, Darby & Cushman

[57] ABSTRACT

A tuning device for a radio receiver comprises a manual tuning system to manually drive a variable capacitor and an automatic tuning system to drive the same by a motor, wherein the mechanism for transmitting a motive force of a manipulated tuning knob to the variable capacitor in the manual tuning mode is arranged in a mechanically independent relation with a motive force transmitting mechanism provided by a motor in the automatic tuning mode, and the selection of either one of the two transmitting mechanisms is effected by a clutch mechanism whose connection of either one of the two transmitting mechanisms to the variable capacitor is changed over by a touch switch electrically connected to the tuning knob of the receiver.

15 Claims, 10 Drawing Figures

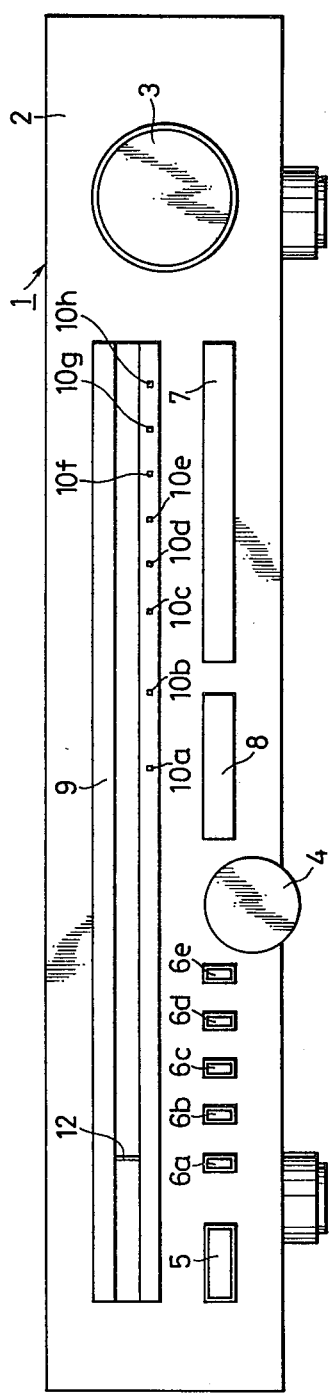
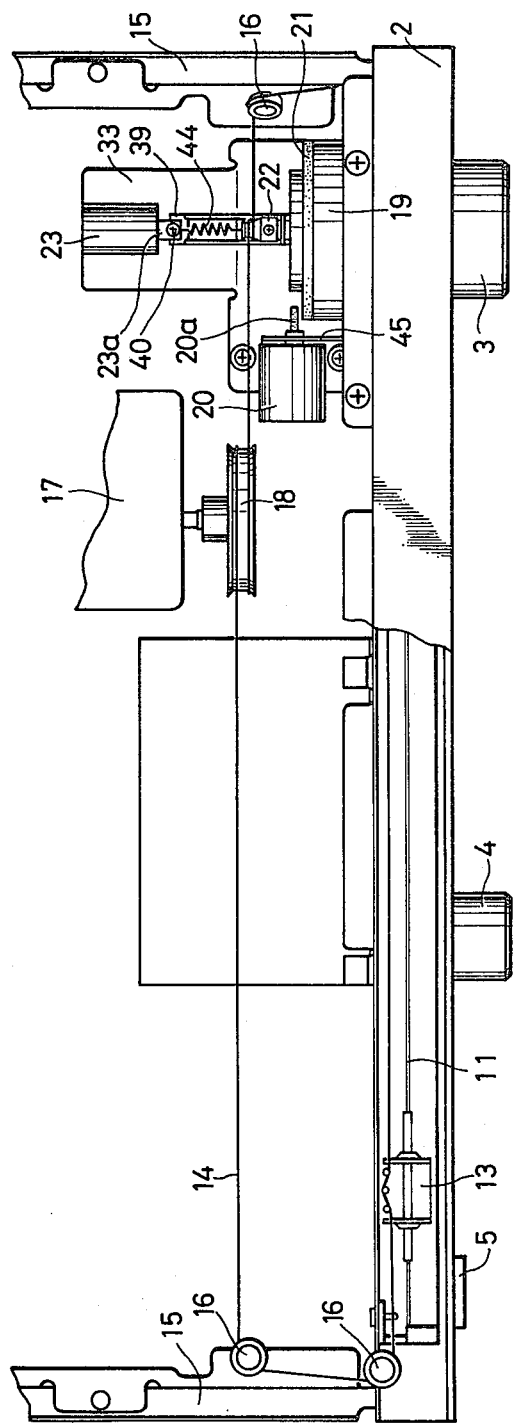

TUNING DEVICE FOR RADIO RECEIVER

BACKGROUND OF THE INVENTION

(a) Field of the Invention

The present invention relates to a tuning device for a radio receiver, and more particularly to a tuning device arranged so that a tuning element can be driven by a motor also, in addition to manual tuning.

(b) Description of the Prior Art

As is well known, automatic tuning in radio receivers is performed by mechanically driving, by a motor, a tuning variable capacitor of a high frequency amplifier circuit and a variable capacitor for varying the oscillation frequency of a local oscillator circuit (hereinafter these capacitors will be referred to simply as tuning variable capacitors), and by electrically detecting the condition of the tuning variable capacitors and thereby controlling the rotation of the motor in accordance with the detection output signal. In such an operation, there has been produced with relative ease, an electrical processing circuit for producing a signal for controlling the motor in accordance with a signal indicating the detected tuning condition. However, with respect to the system for mechanically transmitting the rotation of the motor of the variable capacitor, the system has been unsatisfactory with respect to precision, response and operability.

SUMMARY OF THE INVENTION

It is, therefore, a primary object of the present invention to provide a tuning device for a radio receiver which has an improved precision of respondability of the mechanical transmission system intended for transmitting the rotation of the motor to the tuning element.

Another object of the present invention is to provide a tuning device of the type described above, wherein the motive force transmission system for the automatic tuning mode performed by a motor is arranged to keep mechanical independency from the manual motive force transmission system, and the transmission of the motive force from either one of these two systems is done by a clutch means controlled by a changeover control means.

Still another object of the present invention is to provide a tuning device of the type described above, wherein a fly wheel is incorporated in the tuning knob of the manual motive force transmission system, without causing the inertia of this fly wheel to influence the operation of the motive force transmission system intended for automatic tuning.

A further object of the present invention is to providing a tuning device of the type described above, wherein the changeover of connection of the clutch means to either one of the manual and automatic tuning modes is carried out by merely touching a tuning knob made of a conductive material by the user's bare fingers, thereby greatly improving the operability of the changeover action from the automatic tuning to manual tuning.

BRIEF DESCRIPTION OF THE DRAWINGS

FIG. 1 is a diagrammatic front view of a radio receiver embodying the present invention.

FIG. 2 is a diagrammatic partial plan view of the front portion of the radio receiver of FIG. 1, with its upper cover panel removed.

DETAILED DESCRIPTION OF THE PREFERRED EMBODIMENTS

Figure 3:
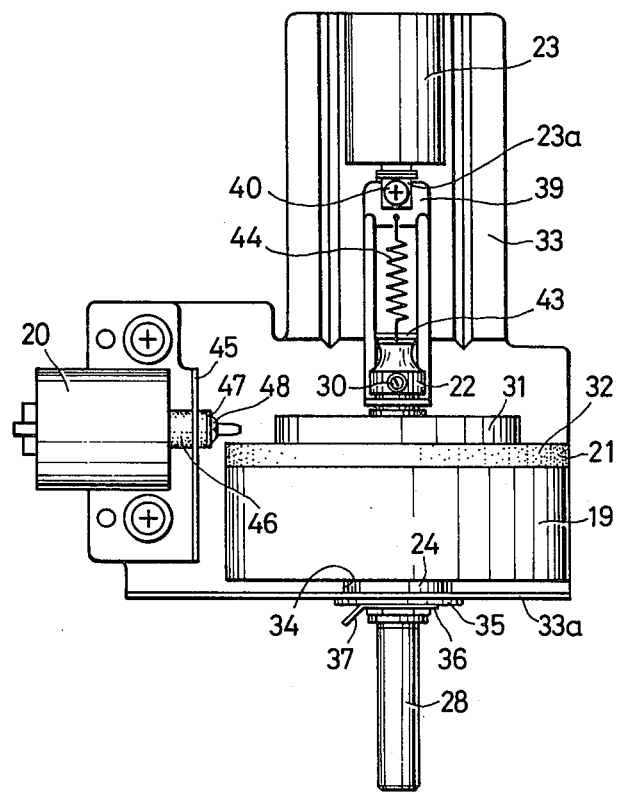
FIG. 3 is a diagrammatic plan view, showing a motor and clutch means which are fixedly mounted on a sub-chassis of the receiver of FIG. 1.

As shown in FIG. 1, a front panel 2 of a radio receiver 1 is provided with members such as: a manipulator or rotatable tuning knob 3 intended for tuning and concurrently serving as a touch element of a so-called touch switch; a rotatable knob 4 for adjusting the sound volume; a push button 5 for connecting the receiver to a power supply; function-selection push buttons 6a through 6e; a signal strength meter 7; a station frequency indicator 8; and a dial indicator section 9. The dial indicating section 9 is provided with push buttons 10a through 10h for preset tuning.

The dial indicator section 9 has a pointer unit 13 provided with a pointer 12, and this pointer unit 13 is slidably mounted on a guide bar 11 which extends horizontally on a rear side of the front panel 2 as shown in FIG. 2. This pointer unit 13 is adapted to be moved by a dial rope 14. This dial rope 14 is applied on a plurality of dial pulleys 16 which, in turn, are secured to a main chassis 15, and is caused to travel sideways in either one of opposite directions in accordance with the rotation of a rope driving pulley which will be described later, to thereby rotate the tuning variable capacitors which will be described later also.

Reference numeral 17 represents a multiple type variable capacitor constituting a part of a high-frequency amplifier circuit and a local oscillator circuit, both of which will be described later. The dial rope 14 is wound around a pulley 18 of this multiple type variable capacitor 17.

Reference numeral 19 represents a fly wheel which is rotatable integrally with the tuning knob 3, 20 a motor for driving the variable capacitor, 21 a clutch plate adapted to be selectively brought into pressure contact with either the fly wheel 19 or the variable capacitor driving motor 20, 22 a rope driving pulley rotatable integrally with the clutch plate 21, and 23 a solenoid for axially driving the clutch plate 21. These component members will be described hereunder in further detail by referring to FIGS. 3 to 8.

Figure 5:
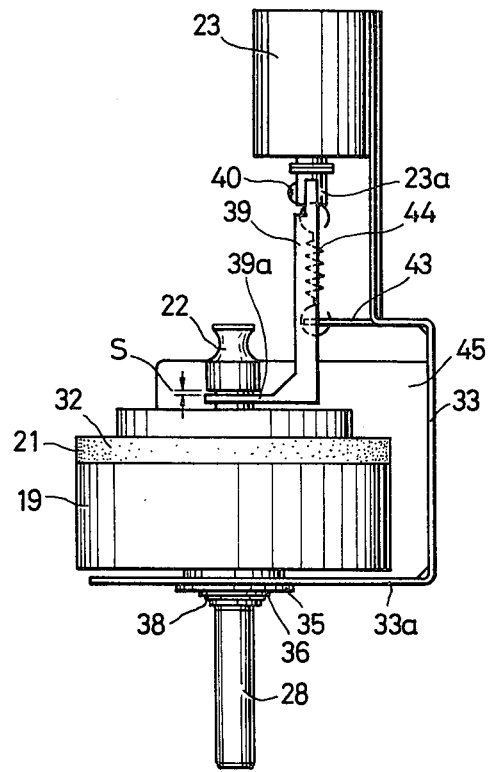
FIG. 5 is a diagrammatic side elevation of the motor and the clutch means of FIG. 3.
Figure 8:
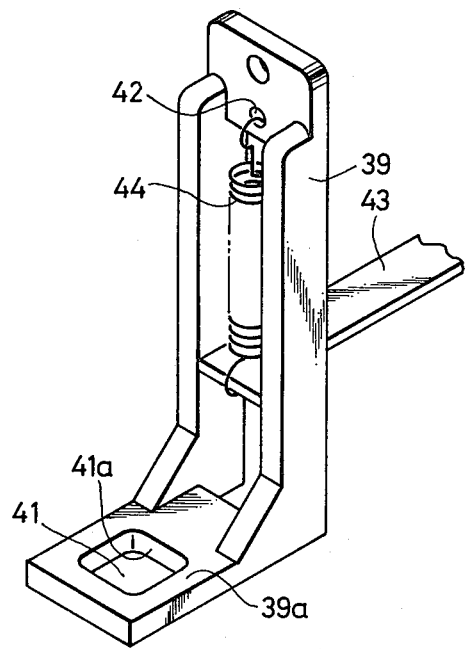
FIG. 8 is a diagrammatic perspective view showing a clutch lever.

As shown in FIGS. 2, 3 and 5, the solenoid 23 is fixedly mounted on a stage which extends generally upright from the rearmost end of a sub-chassis 33. An L-shape non-conductive clutch lever 39 made of synthetic resin as shown in FIG. 8 is fixed, by a screw 40, to the foremost end of a plunger 23a of the solenoid 23.

A coil spring 44 for pulling out the plunger 23a is applied between a spring end anchoring hole 42 formed through that portion of the clutch lever 39 located closer to the plunger and a spring end anchoring lug 43 formed by bending, substantially at a right angle, the upright-extending portion of the sub-chassis 33. This arrangement causes the plunger 23a to be pulled out from the solenoid by said coil spring 44 whenever the solenoid 23 is rendered non-conductive.

A square opening 41 having four slightly rounded corners is formed at a seat portion 39a which is formed at the other end of the clutch lever 39. A clutch bush 29 is adapted to be rotatably received in this round-cornered square opening 41. The clutch lever 39 is arranged to have a length sufficient for producing a clearance S (FIG. 5) between the rope-driving pulley 22 and the seat portion 39a whenever the plunger 23a protrudes. This arrangement serves to alleviate, as much as possible, the load applied to the plunger 23a at the initial stage of its retracting movement during the period that the solenoid 23 is rendered conductive.

Figure 4:
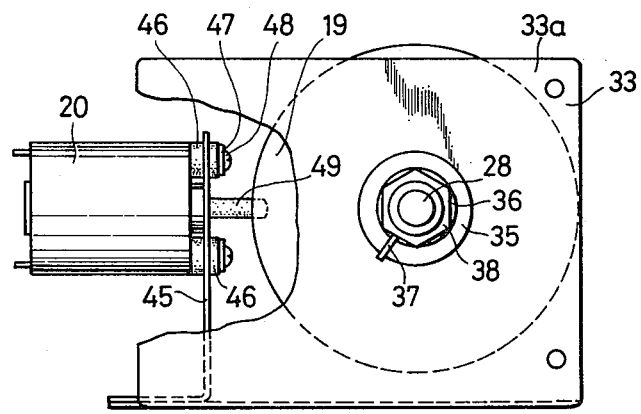
FIG. 4 is a diagrammatic front view, with parts broken away, showing a front view of the motor and the clutch means of FIG. 3.
Figure 7:
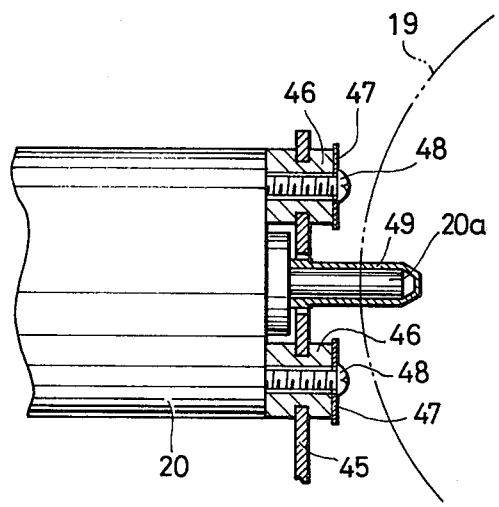
FIG. 7 is a diagrammatic illustration showing the arrangement for the mounting of the motor.

As shown in FIGS. 2 to 4, a motor-supporting plate member 45 having an L-shaped cross section is secured to the sub-chassis 33. The variable capacitor driving motor 20 is fixedly secured, by screws 48, via resilient bushes 46 made of a resilient material such as chloroprene rubber and via washers 47, to said motor supporting plate member 45, as shown in FIG. 7. In this arrangement, the rotation shaft 20a of the motor 20 is positioned to be parallel with the clutch plate 21. Accordingly, when the clutch plate 21 is brought into pressure contact with the rotation shaft 20a of the motor 20 interlockingly with the retracting motion of the plunger 23a of the solenoid 23 as will be described later, the resilient bushes 46 will undergo an appropriate flexure while resisting the force received from the clutch plate 21. Whereby, there is established a pulling stroke sufficient for the clutch plate 21 to completely detach from the fly wheel 19. Also, owing to the fact that the rotation shaft 20a of the motor 20 is brought into pressure contact, with an appropriate resiliency, with the clutch plate 21, the vibration produced by the motor 20 is absorbed by the resilient bushes 46, and thus the generation of noise is prevented. Furthermore, the variation of the load on the rotation shaft 20a of the motor 20 is absorbed also, so that uneven revolutions of the motor can be suppressed.

Also, as shown in FIG. 7, a cap 49 which is made of a urethane rubber or a chloroprene rubber having a large friction coefficient is mounted on the rotation shaft 20a of the motor 20 so that the rotation of the motor 20 can be unfailingly transmitted to the clutch plate 21.

Thus, at the time of a manual tuning operation, i.e. when the solenoid 23 is in its non-conductive state, the clutch plate 21 is resiliently pressed against the fly wheel 19 by the clutch lever 39 which receives a force from the spring 44. Accordingly, the rotational force of the tuning knob 3 which is transmitted to the fly wheel 19 via the dial shaft 28, the wheel shaft 25 and the wheel bushes 27 in this order is transmitted to the clutch plate 21 by virtue of the frictional resistance between the clutch plate 21 and the fly wheel 19, and further it is transmitted to the rope driving pulley 22 via the clutch bush 29. And, the rotation of the tuning knob is transmitted to the pulley 18 via the dial rope 14, so that the variable capacitor 17 is driven to rotate.

On the other hand, at the time of automatic tuning, i.e. when the solenoid 23 is in its conductive state, the clutch plate 21 is detached from the fly wheel 19 by the pulling force of the plunger 23a which is applied thereto via the clutch lever 39. Thus, the clutch plate 21 is resiliently pressed against the rotation shaft 20a of the motor 20. As a result, the rotational force of the motor 20 is transmitted to the clutch plate 21 by virtue of the frictional resistance between the cap 49 and the clutch plate 21. And, in a similar course of actions as described above in connection with the manual tuning mode, the rotational force is transmitted, so that the variable capacitor 17 is driven.

In these two kinds of operations, the motive force transmitting system (a first motive force transmission system) from the tuning knob 3 to the fly wheel 19 inclusive is arranged to be completely separated and mechanically independent from the motive force transmission system (a second motive force transmission system) comprising the motor 20. No force whatever is exerted between these two kinds of motive force transmission systems. In other words, these two transmission systems are able to freely rotate independent of each other.

As such, even in case, as in the above-described embodiment, a fly wheel 19 having a large inertia is contained in the first motive force transmission system or in case a frictional resistance is being generated between such members as the wheel bearing 24 and the wheel shaft 25, it will be understood that, where the clutch plate 21 is connected to the motor 20 side, said inertia or frictional resistance will never exert any influence on the rotation of the motor 20 which constitutes the second motive force transmission system. Because of this arrangement, at the initiation of rotation of the motor, there will not arise the fear that a load is applied to the motor 20 by the inertia and the frictional resistance of the fly wheel 19 which would impair its responding ability in its operation, or that the motor 20 would overrun due to the inertia of the fly wheel 19 when the motor 20 should come to a halt. Thus, it is possible to remarkably improve the precision and responding ability of the variable capacitor driving system of this type. Also, there is another advantage in terms of appearance and design that, in the automatic tuning mode wherein the variable capacitor 17 is driven by the motor 20, the turning knob 3 is not caused to make any revolutions.

Figure 6:
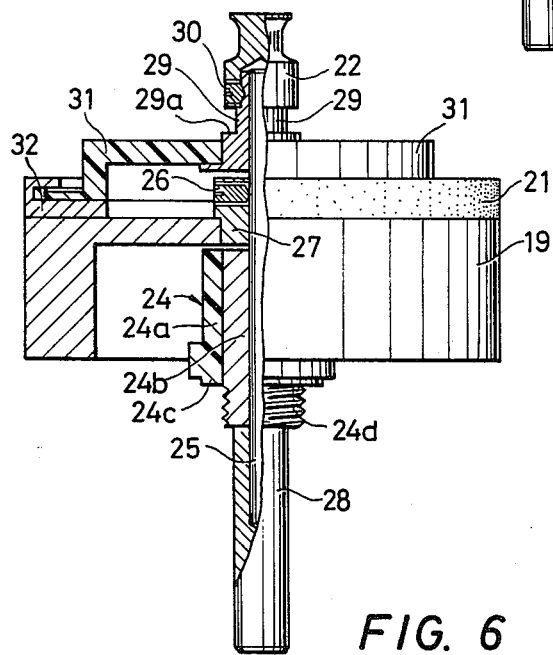
FIG. 6 is a diagrammatic plan view, partly in section, showing the essential portion including a fly wheel and the clutch means.

In FIG. 6, reference numeral 24 represents a wheel bearing secured to the sub-chassis. This wheel bearing 24 is constructed so that its outer portion 24a is made of non-conductive synthetic resin, and its remaining inner portion 24b is made of conductive metal. A wheel shaft 25 is rotatably inserted in said inner portion 24b of this wheel bearing 24. A wheel bush 27 is fixed, by a screw 26, to said wheel shaft 25. The inner circumferential portion of the fly wheel 19 is integrally secured to the wheel bush 27. A dial shaft 28 made of a conductive material and intended to secure the tuning knob 3 is fixedly received on the wheel shaft 25. Thus, the dial shaft 28 is able to rotate integrally with the fly wheel 19, because the wheel shaft 25 and the wheel bush 27 intervene, in secured relationship, between the dial shaft 28 and the fly wheel 19.

A clutch bush 29 made of a material such as brass is received on the wheel shaft 25 for both rotation and axial sliding. Said rope driving pulley 22 is secured, by a screw 30, to the clutch bush 29. Also, a clutch plate supporting disk 31 which is molded with a synthetic resin such as acetal copolymer is secured to the clutch bush 29. A friction layer 32 made of a material such as chloropene rubber having a large friction coefficient covers both the upper and bottom surfaces of the flange portion of the clutch plate supporting disk 31. As will be described later in further detail, this layer 32 serves to produce a sufficient friction force when the clutch plate 21 is brought into pressure contact with the fly wheel 19. Thus, the clutch plate 21 is constructed jointly by the clutch plate supporting disk 31 and the friction layer 32. When the dial shaft 28 is rotated and the clutch plate 21 is in pressure contact with the fly wheel 19, the rotation of the fly wheel 19 is transmitted to the rope driving pulley 22 via the clutch plate supporting disk 31 and the clutch bush 29. Accordingly, this pulley 22 will be caused to rotate integrally with the dial shaft 28.

On the other hand, as illustrated in FIG. 2, the subchassis 33 is secured sideways within the main chassis 15. Those members such as the wheel bearing 24, shown in FIG. 6, the variable capacitor driving motor 20 and the solenoid 23 are fixedly mounted on this sub-chassis 33.

More particularly, as shown in FIGS. 3 to 6, a shoulder portion 24c which is formed on the outer portion 24a of the wheel bearing 24 is inserted, from the rear side of a bent portion 33a of the sub-chassis 33, through a hole 34 formed through said bent portion 33a which is bent substantially at a right angle relative to the main portion of this sub-chassis 33. A ring 35 which is made of an insulating material is fitted onto the shoulder portion 24c externally of said hole 34. A washer 36 made of a conductive material is placed onto this ring 35. Next, a nut 38 is screwed onto the threaded portion 24d formed on the inner portion 24b of the wheel bearing 24. A detection terminal 37, shown in FIG. 3, of a touch switch which will be described later is formed by extending a portion of the washer 36 to protrude for a short distance.

On the other hand, the tuning knob 3 which is fixedly mounted on the dial shaft 28 is formed by a conductive material which may be a metal such as aluminum. This knob 3 is electrically conductive to said detection terminal 37 of the touch switch via the dial shaft 28, the threaded portion 24d of the wheel bearing 24 and the washer 36, all of which members are conductive. Also, the detection terminal 37 of the touch switch is electrically insulated from the sub-chassis 33 by the non-conductive outer portion 24a of the wheel bearing 24 and by the insulating ring 35. Accordingly, the touch switch will be rendered operative only when a user's finger touches the conductive tuning knob 3.

Figure 9:
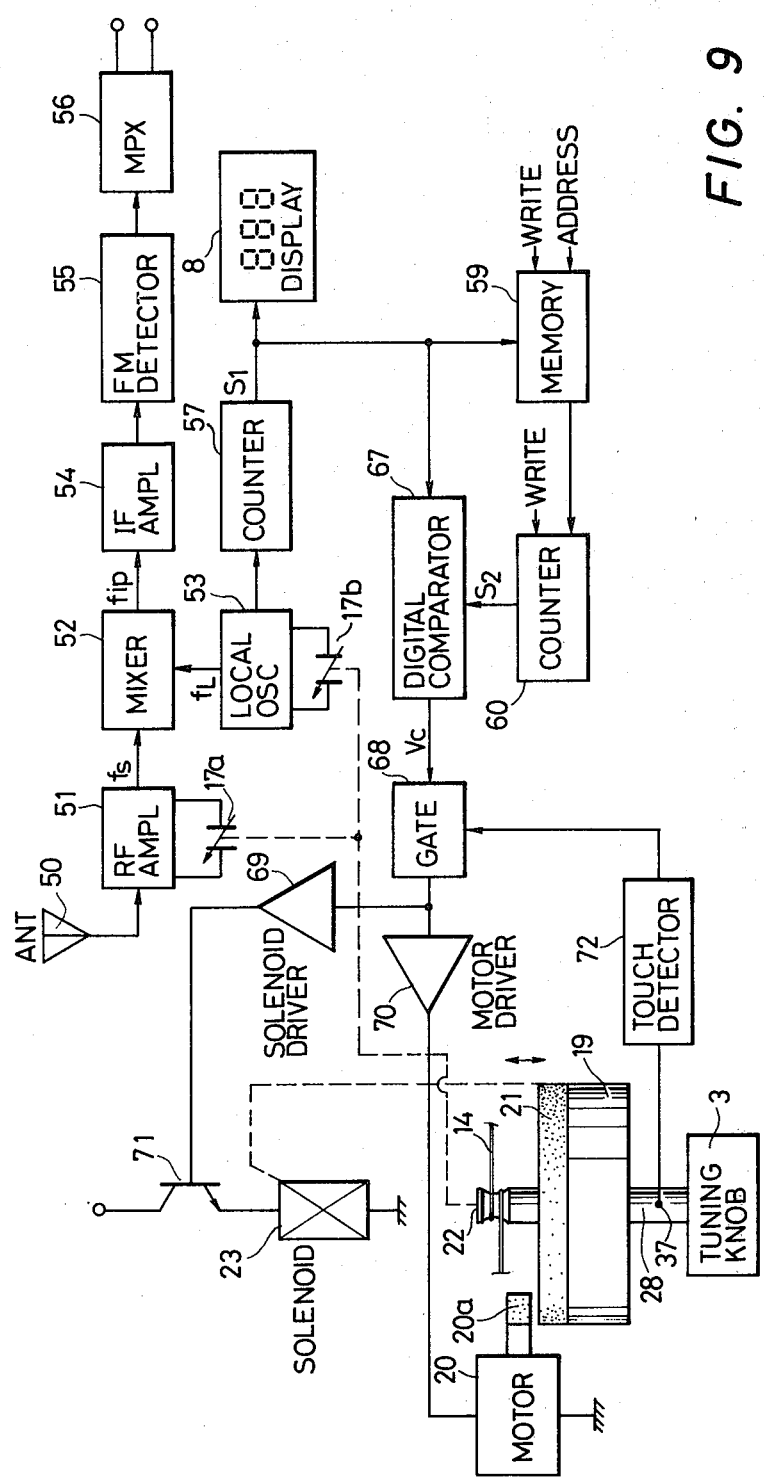
FIG. 9 is a block diagram showing an example of the electrical arrangement of the radio receiver of FIG. 1.

FIG. 9 is a block diagram showing the circuit construction of a radio receiver 1 described above. In this Figure, for example, an FM broadcast wave which is received through an antenna 50 is first amplified by a high frequency amplifier 51, and then it is mixed, by a mixing circuit 52, with a local oscillation output delivered from a local oscillator circuit 53. And, the resulting intermediate frequency signal obtained by said mixing circuit 52 is amplified by an intermediate frequency amplifying circuit 54, and then it is demodulated via an FM detection circuit 55 and a multiplex decoder 56.

Reference numerals 17a and 17b represent a component variable capacitor member constituting said multiple type variable capacitor 17. The component variable capacitor member 17a is intended for changing a tuned frequency $f_s$ of the high frequency amplifying circuit 51, and the component variable capacitor member 17b is used to change an oscillation frequency $f_L$ of the local oscillating circuit 53.

Reference numeral 57 represents a counter which, after being preset with a numerical value (BCD value) corresponding to an intermediate frequency $(f_s-f_L)$ $(=f_S-f_L)$, will count local oscillation outputs for every predetermined time (for example, 10 μsec), and will output a signal $S_1$ representing a numerical value (BCD value) corresponding to a frequency of three figures of 100 kHz or more among which $f_s$ $(=f_{ip}+f_L)$. Also, reference numeral 8 is the station frequency indicator for indicating an output of said counter 57.

Reference numeral 59 represents a presetting memory which is arranged so that it is preliminarily tuned perfectly to the respective frequencies of broadcasts from a plurality of broadcasting stations, and which stores signals $S_1$ corresponding to the numerical values of these tuned frequencies of the respective broadcast stations upon being applied thereto with a write-in command signal and with an address designation signal at each time desired.

Reference numeral 60 represents a counter for storing the outputted numerical values from said memory 59 upon being applied with a write-in command signal. Also, reference numeral 67 represents a digital comparator of the so-called charge pump type, and is arranged so as to perform digital computation (subtraction) of a BCD value $S_1$ supplied from the counter 57 and a BCD value $S_2$ supplied from the counter 60, and to output a dc voltage $V_c$ having a polarity and a level corresponding to the difference between said signals $S_1$ and $S_2$. This dc voltage $V_c$ is supplied, upon conduction of a gating circuit 68, to both a solenoid driving circuit 69 and a motor driving circuit 70. The solenoid driving circuit 69, upon being inputted with a dc voltage $V_c$, delivers an output to render a transistor 71 conductive irrespective of the polarity of this dc voltage. Also, the motor driving circuit 70 delivers an output corresponding to the polarity and the level of the dc voltage $V_c$, to rotate the motor 20.

On the other hand, the gating circuit 68 is constructed so as to be rendered nonconductive by an output (touch output) of a touch detecting circuit 72 which is generated when a part of a human body such as the tip of a bare finger of the user touches the tuning knob 3. This touch detecting circuit 72 may be such a circuit as disclosed in, for example, U.S. Pat. No. 3,806,820 issued on Apr. 23, 1974. The occurrence of a touch onto the tuning knob 3 by a part of human body is detected via the detection terminal 37 which is electrically connected to the dial shaft 28, as described above.

Thus, if a user gives an address designation signal to the memory 59 and a write-in command signal to the counter 60 by appropriately operating the function selecting push buttons 6a through 6e or the presetting push buttons 10a through 10h as required which are arranged on the front panel 2 shown in FIG. 1, the digital comparator 67 will output a dc voltage $V_c$ corresponding to the difference between the then tuned frequency and the desired preset frequency. Upon receipt of this dc voltage $V_c$ by said solenoid driving circuit 69, the solenoid 23 is energized. Whereby, the clutch plate 21 is brought into pressure contact with the rotation shaft 20a of the motor 20. Concurrently therewith, said dc voltage $V_c$ is delivered to the motor 20 via the motor driving circuit 70, so that the motor 20 is rotated in a direction corresponding to the polarity of the dc voltage $V_c$ and at a speed corresponding to the level of this dc voltage $V_c$. This rotation force of the motor is transmitted to the rope driving pulley 22 via the clutch plate 21, so that the dial rope 14 is driven to be pulled. The pulling force of the dial rope 14 is transmitted, as a rotational force, to the tuning multiple type variable capacitor 17 via the pulley 18. Whereby, the component tuning variable capacitor member 17a incorporated in the high frequency amplifying circuit 51 and the component variable capacitor member 17b for frequency varying which is incorporated in the local oscillation circuit 53 are rotated, so that a desired tuning operation is effected. Thus, the motor 20 will be brought to a halt upon agreement between the numerical value corresponding to the desired frequency which has been preset in the counter 60 and the value of count done by the counter 57.

On the other hand, during the aforesaid automatic tuning mode, if the tuning knob 3 is touched by the bare fingers of the user, this will cause a touch detecting circuit 72 to be actuated, and its output will cause non-conduction of the gating circuit 68. Whereupon, the energization of the solenoid 23 is ceased, and the actuation of the motor 20 is ceased also. As a result, the clutch plate 21 is caused to detach from the rotation shaft 20a of the motor 20, and the clutch plate 21 will be pressed against the fly wheel 19 by the force of the spring 44. Thus, the rotational force of the tuning knob 3 will be transmitted to the variable capacitor 17 as described above. More particularly, even in the midst of the automatic tuning operation relying on the drive supplied by the motor, the operation mode can be immediately switched over to the manual tuning mode by a mere touching of a bare finger to the tuning knob 3, without requiring any special changeover operation, and thus the selection of a desired broadcast station is remarkably simplified. It shoud be understood here that the detailed description of the digital circuitry shown in FIG. 9 is disclosed in U.S. patent application Ser. No. 145,349 filed on Apr. 30, 1980, the contents of which are incorporated herein by reference.

Figure 10:
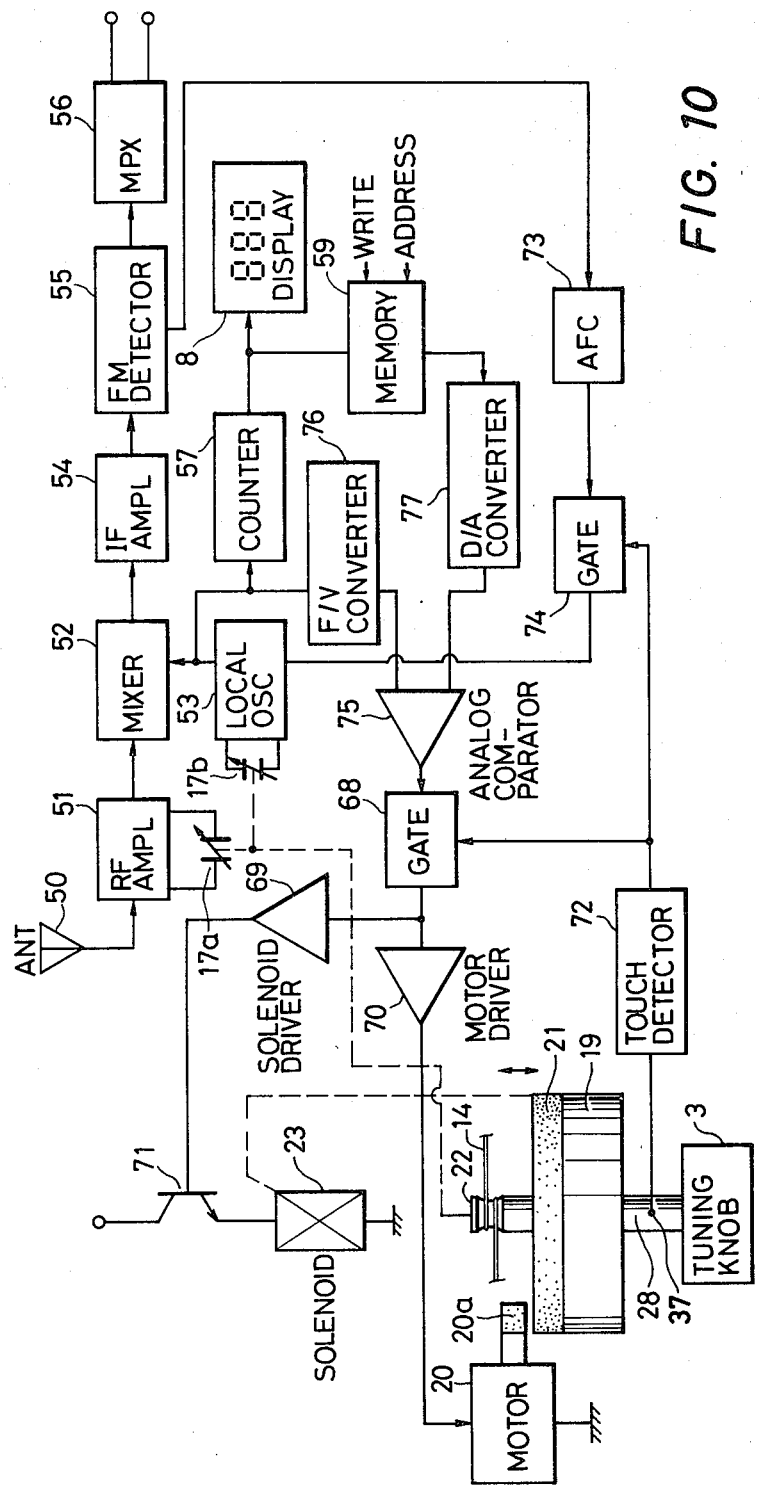
FIG. 10 is a block diagram showing another example of the electrical arrangement of the radio receiver of FIG. 1.

FIG. 10 is a block diagram showing another example of the circuit arrangement of the radio receiver embodying the present invention. This circuitry features a receiver arranged so that a detection output of the FM detection circuit 55 is introduced to an AFC (automatic frequency control) circuit 73 to generate a frequency compensation signal. This latter signal is supplied to a local oscillation circuit 53 via a gating circuit 74, to thereby automatically correct for an out-of-tuning condition resulting from, for example, fluctuation of local oscillation frequency, wherein the novel feature is that the gating circuit 74 is adapted to become nonconductive by an output of the touch detecting circuit 72. Owing to this arrangement, during the manual tuning mode by a manipulation of the tuning mode knob 3, the AFC circuit 73 is disabled to eliminate fluctuation of the local oscillation frequency due to the influence of said AFC circuit 73, to thereby secure a tuning point with an increased sharpness. In this instant embodiment, an analog comparator 75 is employed in lieu of the digital comparator 67 which is employed in the preceding embodiment. Also, a frequency-to-voltage converter circuit 76 and a digital-to-analog converter 77 are provided on the output side of said local oscillation circuit 53 and the memory 59, respectively, so as to perform comparison processing in analog fashion. Other portions are similar to the embodiment in FIG. 9 and their description is omitted.

What is claimed is:

1. A tuning device for a radio receiver capable of selectively carrying out automatic and manual tuning operations, comprising:
   a variable tuning element for determining a tuning frequency of the receiver;
   a manipulator for manually operating said tuning element in the manual operation;
   a motor for operating said tuning element in the automatic operation;
   clutch means for selectively transmitting to the tuning element an operating force for said element from either one of said manipulator and said motor;
   first operating force transmitting means to transmit the operating force from said manipulator to said clutch means;
   second operating force transmitting means independently operated relative to said first transmitting means to transmit the operating force from said motor to said clutch means; and
   clutch control means to control said clutch means to couple to said tuning element said first transmitting means in the manual operation or said second transmitting means in the automatic operation;
   wherein said clutch means comprises
   a rotatable clutch plate adapted to selectively receive an operating force from either said first or second transmitting means, and
   clutch driving means for driving said clutch plate to receive one of said operating forces.

2. A tuning device for a radio receiver capable of selectively carrying out automatic and manual tuning operations, comprising:
   a variable tuning element for determining a tuning frequency of the receiver;
   a manipulator for manually operating said tuning element in the manual operation;
   a motor for operating said tuning element in the automatic operation;
   clutch means for selectively transmitting to the tuning element an operating force for said element from either one of said manipulator and said motor;
   first operating force transmitting means to transmit the operating force from said manipulator to said clutch means;
   second operating force transmitting means independently operated relative to said first transmitting means to transmit the operating force from said motor to said clutch means; and
   clutch control means to control said clutch means to couple to said tuning element said first transmitting means in the manual operation or said second transmitting means in the automatic operation;
   wherein said first transmitting means comprises a rotatable fly wheel interlocked with said manipulator which is also rotatable, and a first force transmitting shaft for rotatably supporting said fly wheel;
   wherein said second transmitting means comprises a second force transmitting shaft coupled to a rotary shaft of said motor and disposed at a right angle relative to said first force transmitting shaft of said first transmitting means at a distance therefrom; and
   wherein said clutch means comprises a rotatable clutch plate adapted to selectively receive an operating force from either said fly wheel or said second force transmitting shaft, and clutch driving means for driving said clutch plate to couple to one of said fly wheel and said second force transmitting shaft.

3. A tuning device according to claim 1 or 2 wherein the receiver includes a local oscillator and a radio signal frequency amplifier, in which said tuning element is a multiple type variable capacitor, and comprises a first variable capacitor member for said local oscillator of said receiver and a second variable capacitor member for said radio signal frequency amplifier of said receiver.

4. A tuning device according to claim 2, in which said supporting means comprises a wheel shaft fixedly carrying said fly wheel and receiving a rotation of said manipulator and a wheel bearing mounted for rotatably receiving said wheel shaft.

5. A tuning device according to claim 2, in which said second force transmitting shaft is comprised of a rotary shaft of said motor.

6. A tuning device according to claim 5 including frame means for carrying the receiver, in which said motor is secured to said frame means of the receiver via resilient members, and said rotary shaft of said motor is covered with a cap having a large friction coefficient.

7. A tuning device for a radio receiver capable of selectively carrying out automatic and manual tuning operations, comprising:
  a variable tuning element for determining a tuning frequency of the receiver;
  a manipulator for manually operating said tuning element in the manual operation;
  a motor for operating said tuning element in the automatic operation;
  clutch means for selectively transmitting to the tuning element an operating force for said element from either one of said manipulator and said motor;
  first operating force transmitting means to transmit the operating force from said manipulator to said clutch means;
  second operating force transmitting means independently operated relative to said first transmitting means to transmit the operating force from said motor to said clutch means; and
  clutch control means to control said clutch means to couple to said tuning element said first transmitting means in the manual operation or said second transmitting means in the automatic operation;
  wherein said clutch means comprises:
  a rotatable clutch plate adapted to selectively receive an operating force from one of said first and second transmitting means;
  a pulley mounted coaxially with said clutch plate;
  a dial rope applied between said pulley and said tuning element; and
  clutch driving means for driving said clutch plate to receive one of said operating forces.

8. A tuning device according to claim 7 wherein the first transmitting means includes a first force transmitting shaft, in which said clutch plate is disposed between said first and second transmitting means for being movable in directions parallel with the first force transmitting shaft,
  said second transmitting means including a second force transmitting shaft disposed at a right angle to said first shaft at a distance therefrom,
  said clutch plate receiving the operating force from said first transmitting means after the plate moves in a certain direction to make friction contact with said first shaft, and receiving the operating force from said second transmitting means after the clutch plate moves in an opposite direction to make friction contact with said second shaft.

9. A tuning device according to claim 8, in which said clutch plate comprises:
  a flanged disk member rotatably and slidably supported on said first shaft of said first transmitting means; and
  a skid-inhibiting member made of a material having a large friction coefficient and applied to upper and bottom surfaces of the flange portion of said disk member, and adapted to be selectively brought into pressure contact with one of said first and second transmitting means.

10. A tuning device according to claim 7, in which said clutch driving means comprises:
  a solenoid having a plunger telescopically movable into and out of the solenoid;
  a clutch lever for transmitting actions of said plunger to cause said clutch plate to receive motive force selectively from either of said first and second transmitting means.

11. A tuning device for a radio receiver capable of selectively carrying out automatic or manual coarse tuning operation each for selecting varying a tuning frequency of the receiver corresponding to one of a plurality of broadcast frequencies in a broadcast frequency band, comprising:
  a variable tuning element for determining the tuning frequency of the receiver;
  a manipulator for manually operating said tuning element in the manual operation;
  a motor for operating said tuning element in the automatic operation;
  clutch means for selectively transmitting to the tuning element an operating force for said element from either one of said manipulator and said motor;
  first operating force transmitting means to transmit the operating force from said manipulator to said clutch means;
  second operating force transmitting means independently operated relative to said first transmitting means to transmit the operating force from said motor to said clutch means; and
  clutch control means to control said clutch means to couple to said tuning element said first transmitting means in the manual operation or said second transmitting means in the automatic operation;
  wherein said clutch control means comprises:
  touch detecting means for detecting a touch of a receiver user of said manipulator and for producing a detection output; and
  touch switch means actuated upon receipt of the detection output from said touch detecting means for establishing the manual tuning operation the automatic tuning operation being established upon removal of a receiver user's touch from said manipulator.

12. A tuning device according to claim 11, in which said touch detecting means comprises:
  said manipulator being made of a conductive material; and
  a detection terminal electrically connected to said manipulator and to said touch switch means.

13. A tuning device according to claim 10 including automatic tuning circuit means and clutch driving means, in which said touch switch means includes:

an input connected to an output of the automatic tuning circuit means;

an output connected to the clutch driving means and to said motor;

a gate circuit connected between said input and output of the touch switch means; and a control terminal connected to said touch detecting means;

said gate circuit being adapted to be nonconductive upon receipt, at said control terminal, of the detection output from the touch detecting means.

14. A tuning device according to claim 13, in which said automatic tuning circuit means comprises:

a memory presettable with desired station frequencies;

means for generating a signal indicative of out-of-tuned frequency by comparison of an output signal from said memory with a received frequency signal determined by said tuning device;

wherein the output signal of said generating means is input to said gate circuit.

15. A tuning device according to claim 13 including an AFC circuit and a local oscillation circuit, in which said touch switch means includes:

another gate circuit adapted to be nonconductive upon receipt, at said control terminal, of the detection output from said touch detecting means;

said another gate circuit being connected between said AFC circuit and said local oscillation circuit.

* * * * *

UNITED STATES PATENT AND TRADEMARK OFFICE
CERTIFICATE OF CORRECTION

PATENT NO. : 4,389,732
DATED : June 21, 1983
INVENTOR(S) : Yasumasa Sasahara, Hiroshi Kuroda It is certified that error appears in the above-identified patent and that said Letters Patent is hereby corrected as shown below:

Claim 11, line 2, (Col. 10, line 25) delete "coarse";

Claim 11, line 3, (Col. 10, line 26) delete "varying";

Claim 11, line 33, (Col. 10, line 56) add a comma after "operation".

Claim 13, line 1, (Col. 10, line 66) change "10" to --11--.

Signed and Sealed this

Thirty-first Day of July 1984

[SEAL]

Attest:

GERALD J. MOSSINGHOFF

Attesting Officer  Commissioner of Patents and Trademarks